United States Patent [19]

Hietala

[11] Patent Number: 5,166,642
[45] Date of Patent: Nov. 24, 1992

[54] MULTIPLE ACCUMULATOR FRACTIONAL N SYNTHESIS WITH SERIES RECOMBINATION

[75] Inventor: Alexander W. Hietala, Cary, Ill.

[73] Assignee: Motorola, Inc., Schaumburg, Ill.

[21] Appl. No.: 836,681

[22] Filed: Feb. 18, 1982

[51] Int. Cl.$^5$ .............. H03C 3/09; H03L 7/197
[52] U.S. Cl. .................. 331/1 A; 331/16; 331/25; 332/127; 375/120; 455/76; 455/119; 455/260
[58] Field of Search .............. 331/1 A, 16, 25; 332/127, 128; 375/120; 455/76, 119, 260

[56] References Cited

U.S. PATENT DOCUMENTS

| | | | |
|---|---|---|---|
| 4,609,881 | 9/1986 | Wells | 331/1 A |
| 4,816,774 | 3/1989 | Martin | 331/1 A |
| 5,038,117 | 8/1991 | Miller | 331/16 |
| 5,070,310 | 12/1991 | Hietala et al. | 331/1 A |

Primary Examiner—Siegfried H. Grimm
Attorney, Agent, or Firm—Kirk W. Dailey; Robert H. Kelly; Rolland R. Hackbart

[57] ABSTRACT

A fractional-N type frequency synthesizer (700) for use in a radiotelephone (901). The synthesizer (700) utilizes multiple latched accumulators (401, 403, 405, 407), within an accumulator network, to perform multiple integrals of an input signal (439). The outputs of the accumulators are combined in series to form a data output signal (453). The data output signal (453) is input to a divider network (703) and used as a variable divisor of the frequency input from a variable oscillator (701) into the divider network (703).

22 Claims, 5 Drawing Sheets

MULTIPLE ACCUMULATOR FRACTIONAL N SYNTHESIS WITH SERIES RECOMBINATION

FIELD OF THE INVENTION

This invention relates generally to frequency synthesizers and more particularly to a fractional N frequency synthesizer employing multiple accumulators in a latched configuration with series recombination. The latched configuration operates synchronously and enables the system to operate at higher frequencies than a simple ripple system, thereby, reducing the spurious signals.

BACKGROUND OF THE INVENTION

Phase-locked loop (PLL) frequency synthesis is a well known technique for generating one of many related signals from a voltage controlled oscillator (VCO). In a single loop PLL, an output signal from the VCO is coupled to a programmable frequency divider. The programmable frequency divider divides by a selected integer number, providing a frequency divided signal to a phase detector. The phase detector compares the frequency divided signal to a reference signal from another fixed frequency oscillator. Any difference in phase between the frequency divided signal and the reference signal is output from the phase detector, coupled through a loop filter, and applied to the VCO. The phase difference signal causes the output signal from the VCO to change in frequency such that the phase error between the frequency divided signal and the reference signal is minimized. Since the programmable divider divides by integers only, the step size of the programmable divider constrains the output frequency. With the single loop PLL, an engineering compromise must be struck between the competing requirements of loop lock time, output frequency step size, noise performance, and spurious signal generation.

In order to overcome the limitations of the single loop PLL, programmable frequency dividers capable of dividing by nonintegers have been developed. Output frequency step sizes which are fractions of the reference signal frequency are obtained while maintaining a high reference frequency and wide loop bandwidth. A discussion of fractional-N synthesis may be found in U.S. Pat. No. 4,816,774. As described therein, two accumulators are employed to simulate the performance of fractional synthesis. The simulation switches between different integer values of divisors without the attendant spurious signals generated by such switching. The two accumulator technique acts to reduce the unwanted spurious signals by cancellation and loop filter rejection.

The reference signal frequency for the fractional-N frequency synthesizer is, therefore, determined by the step size of the VCO output frequency multiplied by the denominator of the programmable divider divisor. Fractional-N synthesis allows the use of a reference frequency which is much higher than the actual channel spacing and allows designs to use wider bandwidths due to the reduction of low frequency spurious outputs. Wider bandwidths allow fast lock times and the possibility of wideband modulation applied to the reference input or the fractional division scheme.

Unfortunately, the system is not perfect and generates some spurious signals output at a frequency equal to the channel spacing. The desired signal output purity is better than the nonfractional system, but by itself may still be insufficient for some high quality systems.

In order to minimize the effects of this spurious output, multiple accumulator fractional-N synthesis systems have been developed. These systems spread out the spurious signals to frequencies at which filtering is inexpensive and simple. By using systems with more than two accumulators this benefit can be dramatically increased.

Some of the present multiple accumulator systems require the accumulators to "ripple" the data. Specifically, on every clock pulse the data must act on the entire digital network. This results in a relatively low upper frequency limit of operation for a multiple accumulator system due to propagation delays in the digital circuitry used to build the system. Finally, some current multiple accumulator systems still maintain a residual noise term which may cause spurious noise signals. These spurious noise signals must be diminished for proper operation of many systems.

SUMMARY OF THE INVENTION

The present invention encompasses a variable frequency synthesizer including at least two latched accumulator networks which are recombined in series. The latched accumulator networks accept a digital number which is used to form a variable divisor.

The frequency of a variable frequency oscillator is controlled by dividing the output signal frequency with the variable divisor in a divider network, forming an intermediate signal. The intermediate signal is compared with a reference signal, generating a first error signal indicative of a phase difference between the two signals. This first error signal is input to the variable frequency oscillator as a control signal to the variable frequency oscillator.

The first accumulator network generates a latched output signal and a first carry output signal representing an integral of the digital number.

The second accumulator network generates a second latched output signal and a second carry output signal representing an integral of the first latched output signal.

The third latched accumulator network generates a third latched output signal and a third carry output signal which represents an integral of the second latched output signal.

The three carry output signals are then combined to form the variable divisor signal. The third carry output signal is differentiated and combined with the second carry output signal forming a fifth output signal. This fifth output signal is then differentiated and combined with the first carry output signal forming the variable divisor signal. This variable divisor signal is input into the divider network.

DETAILED DESCRIPTION OF A PREFERRED EMBODIMENT

Generally, the preferred embodiment encompasses the use of a synthesizer in a radio transceiver. The synthesizer is of a fractional-N type. The synthesizer utilizes multiple latched accumulators, within an accumulator network, to perform multiple integrals of an input signal. The outputs of the accumulators are combined in series to form a data output signal which used as a variable divisor within the synthesizer.

Figure 9:
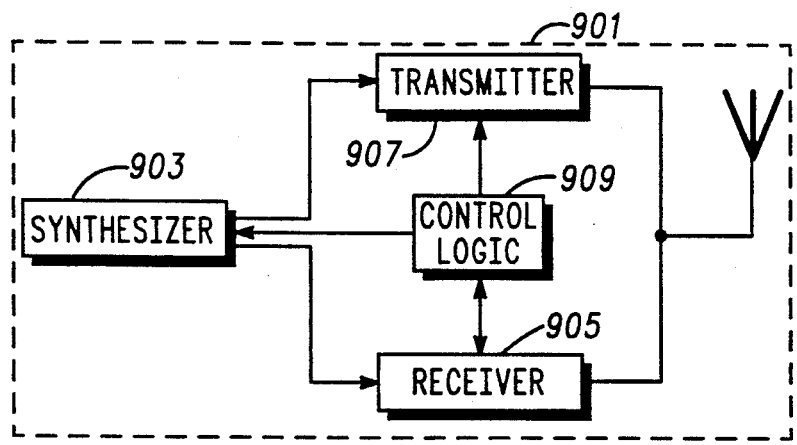
FIG. 9 is a block diagram of a radio transceiver which may employ the present invention.

A basic block diagram of a radiotelephone 901 including a radio transceiver which may employ the present invention is shown in FIG. 9. Such a radiotelephone 901, preferably, is a digital radiotelephone useful in a digital radiotelephone system. The output of the synthesizer 903 is used by the receiver 905 and the transmitter 907 to produce a local oscillator and a transmit signal, respectively. Control over functions of the transceiver 900, such as channel of operation frequency is provided by control logic 909 and is input to the first accumulator of a fractional N synthesizer contained within a synthesizer 903.

Figure 1:
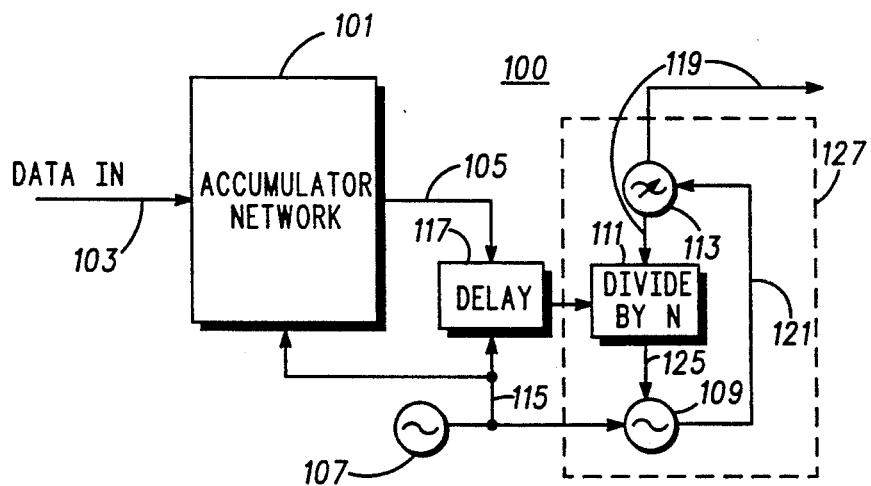
FIG. 1 is a block diagram of a variable frequency synthesizer.

FIG. 1 is a generic block diagram of a fractional N variable frequency synthesizer. The variable oscillator, or VCO 113 provides a desired output frequency signal 119 and feeds the input to a variable digital frequency divider circuit 111. The variable frequency divider circuit output signal 125 is input into a phase comparator 109. A second input of the phase comparator 109 is the reference oscillator signal 115. The phase comparator output signal 121 is fed into the control input of the VCO 113, such that the VCO 113 will adjust its output frequency signal 119 divided by the digital division ratio, N, of the frequency divider circuit 111, to equal the frequency of the reference oscillator 107.

In the preferred embodiment, the division ratio, N, of the frequency divider circuit 111 is varied with a periodic sequence such that the output frequency signal 119 of the VCO 113 may be adjusted in frequency steps equal to a fraction of the frequency of the reference oscillator 107. This periodic sequence is generated by a multiple accumulator network 101 and controlled by the data input signal 103.

Figure 10:
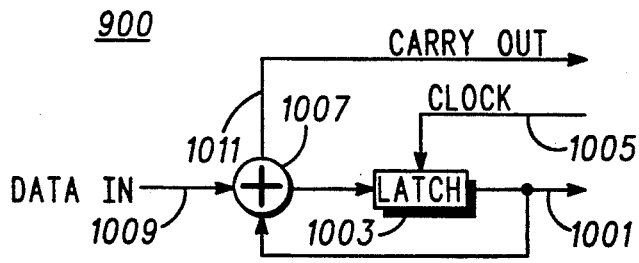
FIG. 10 is an illustration of a typical latched accumulator in accordance with the present invention.

In the preferred embodiment, a latched accumulator configuration as illustrated in FIG. 10 is employed in all of the accumulator networks. Other equally sufficient accumulator configurations may be implemented by one of average skill in the art. Here, the data out signal 1001 of each accumulator is the latched output from the conventional latch circuit 1003. A cascade of such accumulators will have a single adder delay upon each clock cycle of the clock signal 1005. This arrangement results in each accumulator carry output sequence from adder 1007 being delayed by one clock cycle from the output sequence of the next lower order accumulator. It may be noted that other equally sufficient embodiments may employ latched accumulators which latch the carry output signal 1011 and the data output signal 1001.

Figure 2:
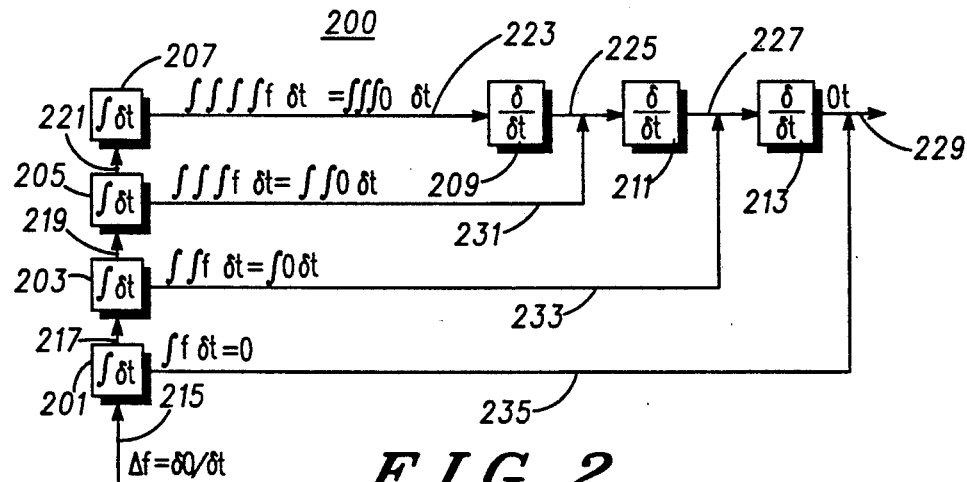
FIG. 2 is a general block diagram of an accumulator network in a (with series recombination) fractional N synthesizer in accordance with the present invention.

FIG. 2 is an illustration of the type of accumulator network employed in the present system. This network utilizes multiple latched accumulators and series recombination allowing for a simple design and DC frequency offsets to be directly added to the data output (DO) 229.

The frequency offset input signal, or data input (DI) 215 is input from the frequency selection circuitry contained within the control logic 909 of FIG. 9 and is applied to the first accumulator 201 in FIG. 2. The first accumulator 201 generates output signals 217, 235 which represent the integral of the data input signal 215. The data output signal 217 is input into the second accumulator 203. The carry output signal 235 is added directly to the differentiator 213, resulting in the data output signal 229. This carry output signal 235 allows DC phase offsets to be directly passed to the data output signal 229. The data output signal 219 of the second accumulator 203 is input into the third accumulator 205, likewise, the data output signal 221 of the third accumulator 205 is input into the fourth accumulator 207.

The carry output signal 223 of the fourth accumulator 207 is differentiated and combined with the carry output signal 231 from the third accumulator 205 resulting in the signal 225. Signal 225 is input to a second differentiator 211 this resulting signal is combined with the second carry output signal 233, from the second accumulator 203. The resulting signal 227 is input into the third differentiator 213.

The illustration of FIG. 2 is used as a generic description of the fractional N synthesis with series recombination, specific implementations of this general method are illustrated in subsequent FIGS. 3, 4, 5, 6, 7 and 8. FIG. 2 as shown without latched output signals or digital delays will dramatically limit its practical utility.

Figure 3:
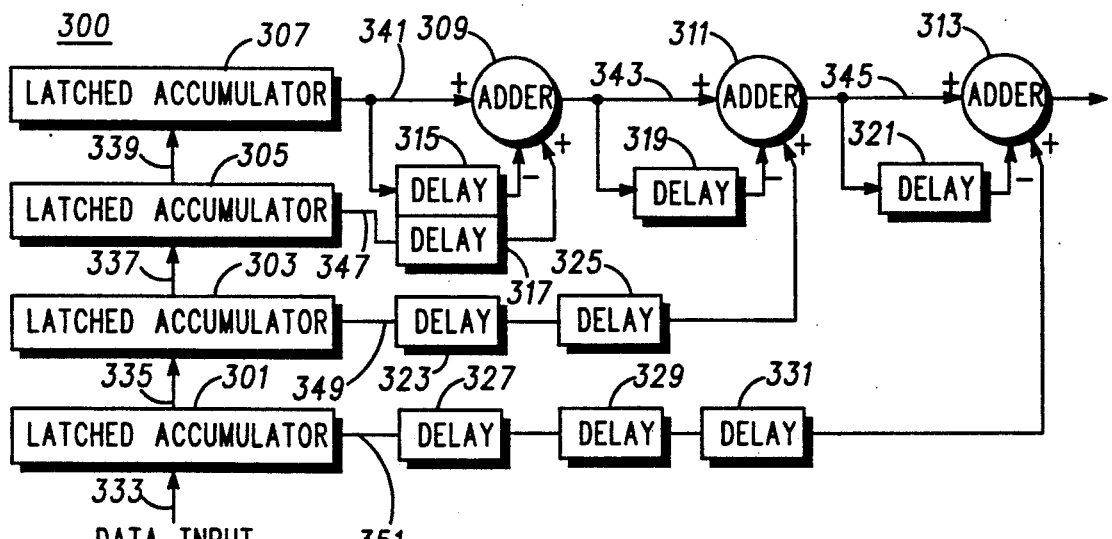
FIG. 3 is an illustration of a latched accumulator network in accordance with the present invention.

FIG. 3 is an implementation of the fractional N synthesis with series recombination illustrated in FIG. 2. The implementation includes signal delays and latched accumulators. It is an important feature of the invention that the data presented from one accumulator to the next accumulator only occurs during one clock cycle. The data never goes from a first accumulator to a third accumulator during one clock cycle, thereby, avoiding the problem of "rippling" through all the accumulators during one clock pulse. The latched accumulators render the network 101 synchronized. The "ripple" effect is the accumulation of delays inherent in the design of the circuit used to implement the design. Ripple accumulators limit the number of accumulators possible in a given accumulator network given a fixed clocking frequency and the digital delays of the circuitry. With a synchronized system, each function has a fixed delay of one clock period. The synchronized system latches the data at each function, so the data is delayed by one function during each clock period. In this manner, a system of many accumulators can operate as fast as a system with only one accumulator.

In the network illustrated in FIG. 3, the total system delay would equal three clock cycles plus the cumulative delay of the three adders 309, 311, 313, due to the internal digital delays. The cumulative delay of the three adders 309, 311, 313 is not present in the implementations of FIGS. 5 and 6, because of the addition of the fixed delays between the adders. In the preferred embodiment, the clock signal is generated from the output signal 125 of the divisor network 111, alternatively, the clock signal could be generated from the output of the reference oscillator 107.

Note, in the preferred embodiment, latched accumulators are used in the implementation because the system is digital. However, an analog equivalent system could be developed in accordance with the present invention which would include analog integrators.

The first accumulator 301 performs a digital integration of the data input signal 333. The output signal 335 is latched at the first occurrence of a clock signal. The second accumulator 303 performs a digital integration of the contents of the first latched accumulator 301, effectively creating a double integral of the data input 333. At the second occurrence of said clock signal, the output of the second accumulator 303 is latched. A third accumulator 305 performs a digital integration of the contents on the latched output of the second accumulator 303, effectively performing a triple integral of the data input 333. The fourth latched accumulator 307 performs a digital integration of the contents of the latched accumulator output of the third accumulator 305, effectively creating a quadruple integral of the input data 333.

The carry output signal 351 of the first accumulator 301 represents that the output frequency (F0) of the VCO 113 has acquired 360 degrees of phase error relative to the frequency of the signal output from the reference oscillator 107. In order to correct this, the data output signal 229 is increased by one integer for the next clock interval and the internal contents of the first accumulator 303 is reduced by its own capacity. This action effectively removes one cycle from the frequency of the phase comparator input signal 125, thus, resulting in a phase correction of 360 degrees at the VCO output signal (FO)119.

The derivatives 209, 211 and 213 of FIG. 2 are represented in FIG. 3 by the combination of a digital delay and an adder such as 315 and 309. A derivative is digitally implemented by holding a previous sample of the signal and subtracting it from a present value of the signal. The adder 309 also functions to combine the carry output of the third latched accumulator 347 with the output of the derivative of the fourth latched accumulator. The resulting signal 343 is sent through two subsequent derivations.

The digital delays allow the carry output signals recombined to be synchronized into the proper clock cycle. The carry output signal 351 is delayed for three subsequent clock cycles before it reaches the adder 313. The carry output signal of the second latched accumulator 349 is delayed two clock cycles before reaching the adder 311. Including the one clock cycle delay incurred from the first latched accumulator 301, the carry output signal reaches the adder 311 at the third clock cycle. The carry output of the third latched accumulator 347 is delayed one clock cycle from its creation before it is added to the adder 309. This one delay occurs after the two delays from the first and second latched accumulators, thereby reaching the adder at the third clock cycle. So the variable divisor signal 229 has a three clock cycle delay plus the ripple effect from the output of the latched accumulator 307 and the three adders 309, 311, 313. This synchronized system allows operation at a much faster clock speed, subsequently a much faster variance of the periodic sequence using the data input signal 333. Recombining the carry output signals of the accumulators in series reduces the number of differentiators needed in the accumulator network. Note that additional fixed delays, beyond those shown in FIG. 4, may be added to the system without any inherent problems, however, these additional delays would not add any effective benefits to the accumulator system.

Figure 4:
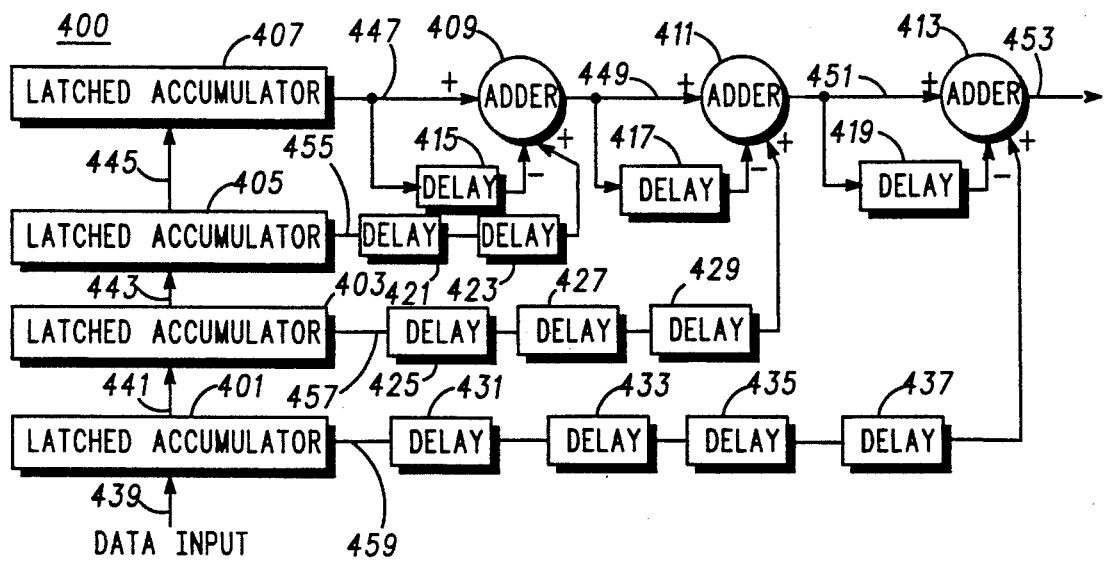
FIG. 4 is an illustration of a double delayed latched accumulator network in accordance with the present invention.

FIG. 4 is a block diagram of a fractional N synthesis with latched accumulators and series recombination. This implementation of the synthesizer accumulator network is similar to that of FIG. 3 with the exception of the added delays 423, 429, 437 which are attached to the first three latched accumulators carry output signals 455, 457, 459. These additional delay elements are added to the lower order accumulators in order to obtain an all pass response to the input data and to obtain a residual noise correction term. The residual noise term may be easily reconstructed in digital form for D to A conversion and application to the loop filter. One example residual error correction circuitry is illustrated in FIG. 7.

Figure 7:
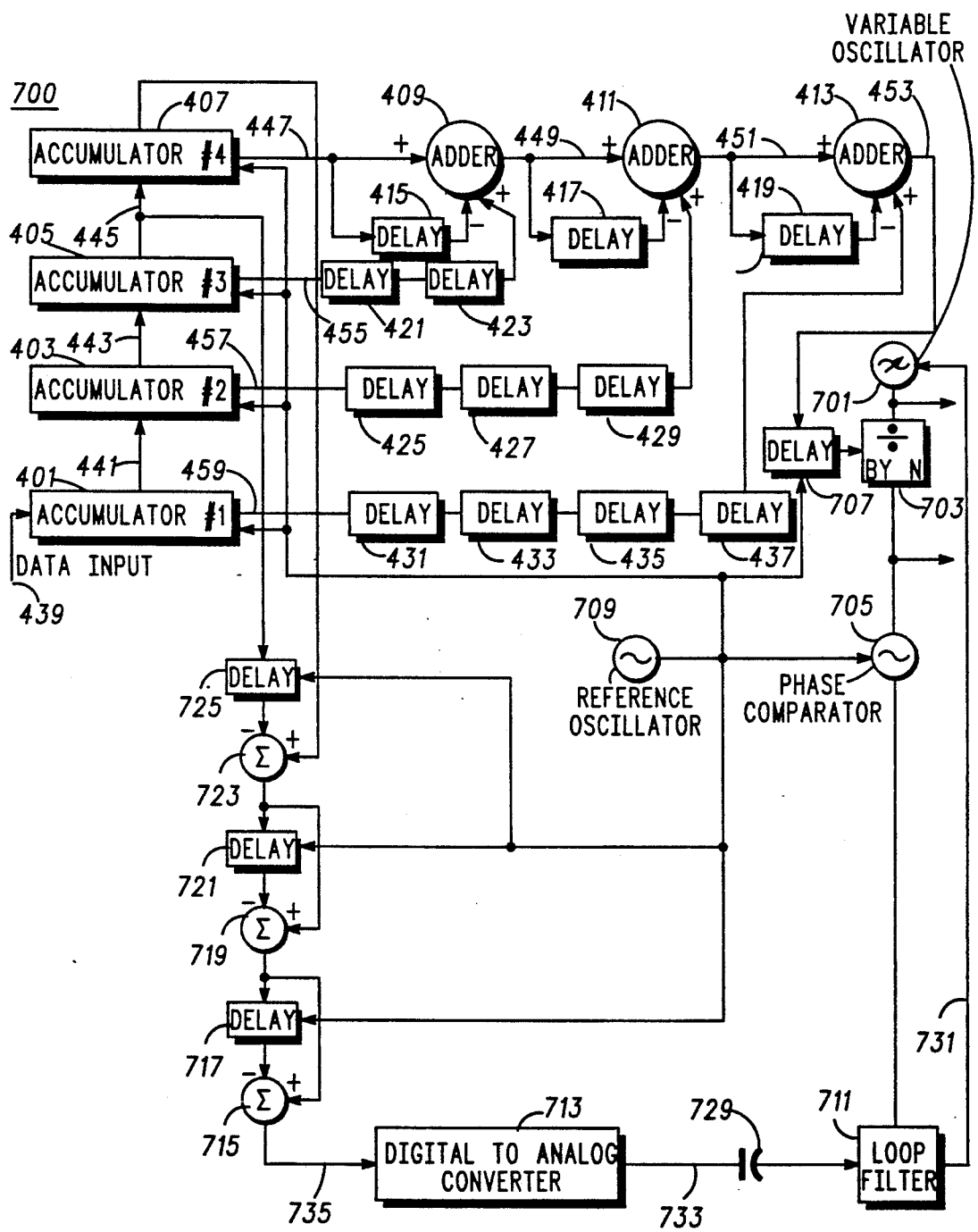
FIG. 7 is an illustration of a double delayed latched accumulator network with residual error correction in accordance with the present invention.

FIG. 7 is a block diagram of a four accumulator system, such as that shown in FIG. 4, in which the internal contents of the highest order latched accumulator 407 and the second highest order latched accumulator 405 are utilized in the subtraction of the residual noise term at the loop filter 711. The internal contents of latched accumulator 405 is delayed once by the delay element 725 and then subtracted from the internal contents of the highest order latched accumulator 407 in the conventional add function 723. This results in a term equal to $-Z^{-1}Q4$ at the output of adder 723. Where Q4 is the quantization noise term. Delay elements 721 and adder 719 form a digital derivative network. The output of adder 719 will be $-Z^{-1}(1-Z^{-1})Q4$. Delay element 717 and the adder 715 form a second digital derivative network. The output of adder 715 will be $-Z^{-1}(1-Z^{-1})^2Q4$. A conventional digital to analog converter 713 then converts this output signal 735 to an analog form and scales the amplitude. The analog output signal 733 is input to the loop filter via a capacitor 729. The capacitor 729 is used as an analog derivative network to convert the voltage output of the D to A converter 713 to a current suitable for application to the loop filter 711 in which the phase comparator drive is a current source. (The current through a capacitor is the time derivative of the voltage.) The correction term 733 has an additional delay as compared to the data output signal 453. This delay is compensated by adding a delay 707 to the data output path to the variable frequency divider 703. Thus, the data sequence at the input of the variable frequency divider 703 is:

$$DO = z^{-5}DI + z^{-1}(1-z^{-1})^4 Q4$$

where:
DO is Data Out signal
DI is Data In signal
$z^{-x}$ represents x clock period delays in the z-transform domain.

Since the phase detector 705 compares phase and not frequency the signal is effectively integrated upon passing through the phase detector 705. Thus, the phase term of the phase detector output can be represented in the Z transform domain as:

$$\phi_{corr} = K_\phi \{DI z^{-5}/(1-z^{-1}) + Q4 z^{-1}(1-z^{-1})^3\}$$

where $K_\phi$ is the phase detector conversion gain. The phase correction term generated by the D to A converter 713 and the capacitor 729 can be represented in the Z transform domain as:

$$\phi_{corr} = -A_{D/A} C \, Q4 z^{-1}(1-z^{-1})^3$$

where $A_{D/A}$ is the D to A converter gain and C is the capacitance of the capacitor 729. If the value of the capacitor 729 is chosen to be equal to the phase detector gain divided by the D\A conversion gain, then a cancelation of any residual noise terms is achieved. The additional delay elements 423, 429, 437 are added in the carry output signals from the first three accumulators 401, 403, 405 in order that the data output sequence noise term will depend only on the fourth accumulator 407. This allows the noise sequence to be easily reconstructed for use in a D to A converter which provides error correction at the loop filter input. Without these delay elements, the output noise term would involve factors from all accumulators. It would be difficult to derive a correction waveform from this type of output.

Note that capacitor 729 may be substituted with another form of derivation. For example, an extra digital delay and an adder placed before the D/A converter such as digital delay 717 and adder 715. For cancellation of the residual noise, the gain of the D\A converter 713 must equal the gain of the phase detector 105.

Figure 5:
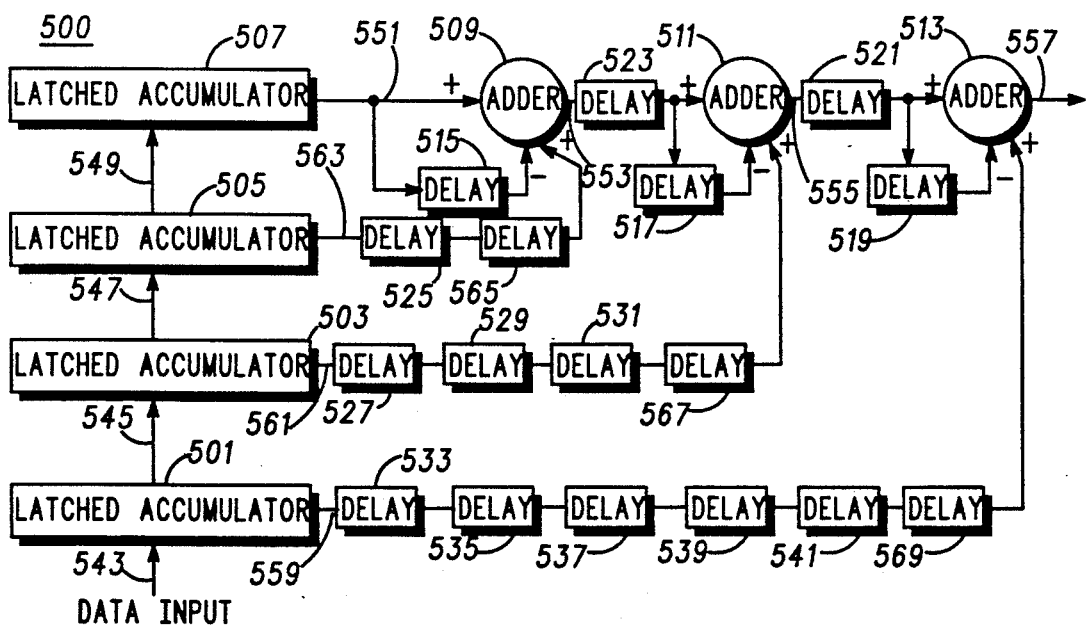
FIG. 5 is an illustration of a double delayed latched network in accordance with the present invention.

FIG. 5 is an alternative implementation of the correction and synthesis accumulator network illustrated in FIG. 4. Here, additional delays 523, 521 are added at the outputs of adders 509, 511 respectively. The purpose of the additional delays is to remove the "ripple" effect caused by the digital delays within the string of adders. As discussed previously, if the output of the fourth latched accumulator 507 is input into the adder 509, without the digital delays 523 and 521, then there would be a ripple effect on the variable divisor signal 557. By adding the delays we eliminate the ripple effect. During the fifth clock cycle, the data would transition from the adder 509 to the adder 511. During the sixth clock cycle, the data would transition from adder 511 to adder 513. Thereby only one digital delay is encountered during each clock cycle. This modification allows a faster clock cycle.

Figure 6:
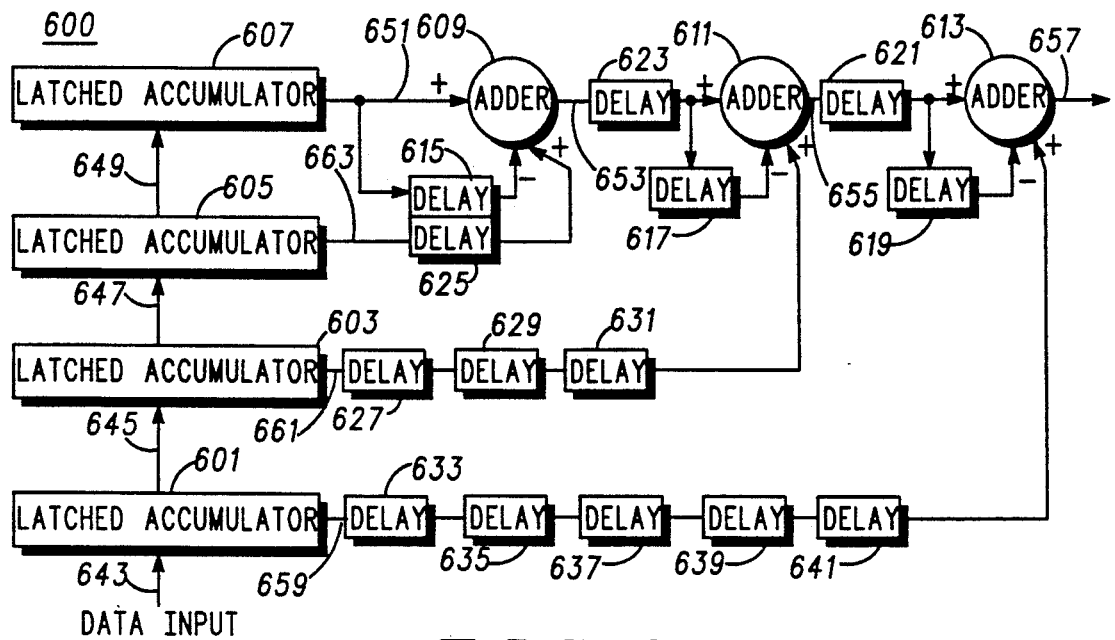
FIG. 6 is an illustration of a single delayed latched accumulator network in accordance with the present invention.

FIG. 6 is an alternative embodiment including the additional delays between the adders but only minimal delays at the outputs of the first three latched accumulators. The embodiment illustrated in FIG. 6 is similar to that of the embodiment of FIG. 3, with the addition of a synchronous series recombination.

In the preferred embodiment, modulation information is applied to the multiple accumulator digital network 400 of the fractional N synthesizer. The modulation information is the 16 least significant bits of a 24 bit number coupled to the data input 439. Since a transceiver which employs the present invention may be effectively utilized in a GSM Pan European Digital Radiotelephone System, rapid frequency changes, modulation, and low spurious and noise levels are realized with a fractional N synthesizer. For modulation, the fractional N synthesizer employs a look-up table to convert the data stream to be transmitted into frequency offsets for the fractional N synthesizer. The loop division of the synthesizer is adjusted in accordance with the input data stream to follow the instantaneous frequency offset required for the GMSK modulated signal. This can be at the offset frequency or directly at the main frequency.

The latched accumulator fractional N synthesizer configuration is operated upon with large accumulators to eliminate spurious signals, to provide D\A correction to reduce discrete spurious signals and to provide direct digital modulation to the PLL. In the GSM system, the data rate is 270.8333 kb with a BT product of 0.3. Where T is the bit period, equal to 1/270.8333 kHz; and B is the baseband bandwidth of the Guassian filter used to shape the baseband data. This results in a baseband bandwidth of approximately 81 kHz which must be passed with low distortion through the PLL as modulation.

The actual frequency offset components of the GMSK signal range from 10 Hz to about 70 kHz. This range determines the length of the accumulators as it will be necessary to synthesize steps of less than 10 Hz in the preferred embodiment of the GSM system. A reference frequency of 26 MHz, requires an accumulator of at least 22 bits, we chose 24 bits for simplicity of using commercially available parts. Obviously, the desired instantaneous frequency offsets due to the modulation are well below the cut-off of the loop filter. Therefore, the frequency synthesizer loop does not attenuate any of the fundamental frequency channelization spurious signals due to the modulation. However, with a multiple accumulator system this problem is overcome.

An overall transfer function for the system was previously defined as follows:

$$DO = z^{-5} DI + z^{-1}(1-z^{-1})^4 Q4$$

This expression may be converted back to the frequency domain by the substitution of $e^{j\pi v} = z$. This results in the following expression for DO. (Note that this is a term-by-term magnitude expression.)

$$DO = DI + (2 - 2\cos\pi v)^2 Q4$$

In the preceding expression, v is the frequency normalized to the folding frequency. The folding frequency is equal to one half the rate at which the accumulator clocks operate.

Figure 11:
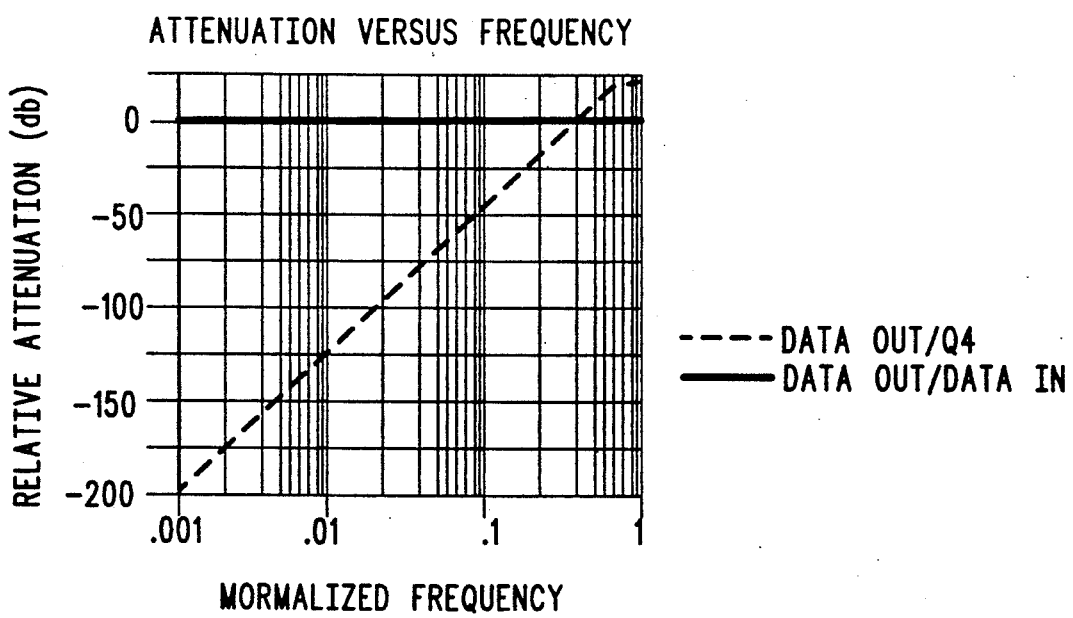
FIG. 11 is a graph of curves illustrating the frequency versus attenuation of each term of the system transfer function in accordance with the present invention.

The frequency versus attenuation curve illustrated in FIG. 11 shows the output of each term of this expression. Note that DI is passed with no distortion to the DO and each of the quantization noise terms (Q) are high pass filtered.

It is possible and preferable to increase the fractionalization such that all spurious outputs are moved to very low frequencies. The combined effects of using many accumulators at a high rate of clock speed results in a large attenuation of the quantization noise of the fractional process. Thus, a large denominator effectively reduces the frequency of the spurious signals such that they fall well below the 3 db corner of the digital high pass filter formed by the multiple accumulator structure. Using many accumulators increases the slope of the high pass filtering action. Increasing the rate of operation moves the corner frequency of the high pass filter up in frequency.

In general the accumulator network 101 generates a time varying division ratio, N. Given a Nth order fractional N system, the accumulators may be latched resulting in a synchronous system in which data does not need to ripple through more than one accumulator during one clock cycle. In a single delay system, the first, or lowest order accumulator output to the variable loop divider is delayed by N−1 clock units, the next lowest level accumulator or the second accumulator is delayed by N−2 and so on until the next last accumulator is delayed by one clock unit and the last, or highest level accumulator is not delayed. In a double delay system one additional delay unit is added to the output of all the accumulators except the last, or highest level accumulator.

Because of the synchronous nature of the system, it is able to operate at higher frequencies and thus allow the PLL bandwidth to be larger. This allows faster lock times and wideband digital modulation through the fractional divider while maintaining superior and predictable spurious performance. A digital representation of the remaining error is obtained in a form suitable to be used in a digital analog converter scheme. The analog output of this conversion is applied to the phase detector output to cancel any residual noise.

The series recombination within the latched accumulator network 101 allows for DC phase corrections to be directly applied to the data output signal. Additionally, the series recombination reduces the number of components necessary in the recombination effort as compared to Pascal triangle systems and the like.

Figure 8:
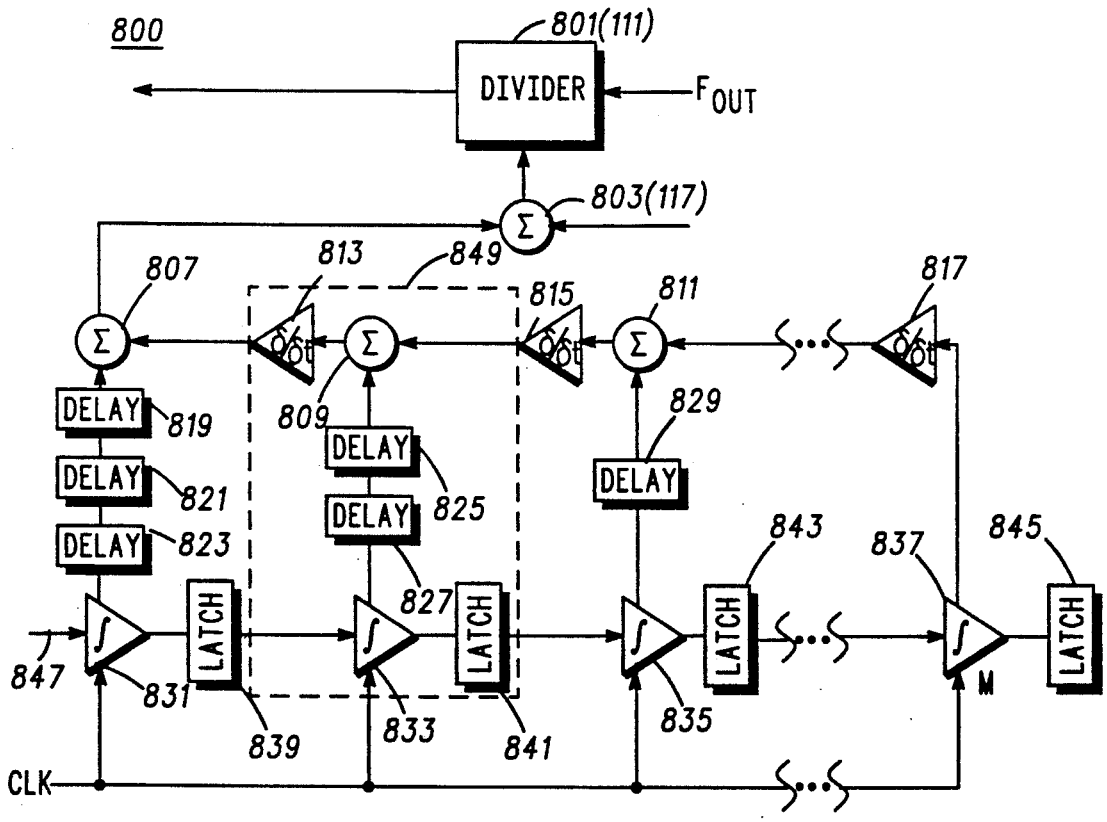
FIG. 8 is an illustration of a single delayed latched accumulator network shown in an alternative form in accordance with the present invention.

FIG. 8 is an illustration of an implementation of fractional N accumulator network as illustrated in FIG. 3. The layout of the network in the illustration is used to simplify description. For example, accumulator network 849 contains the accumulator 833, the latch 841, the digital delay 825, 827, the combiner 809 and the differentiator 813. These can be mapped onto the block diagram of FIG. 3. Additional accumulator networks can be added beyond each accumulator network 849 to make a Nth order accumulator network. With the number of delays in a minimal delay system between the first accumulator 831 and the adder 807 equal to N−1, the second accumulator network having N−2, and the third having N−3, and so on until there are no delays as illustrated in FIG. 8. In a double delay system each accumulator network would have one additional delay except for the last, or highest order accumulator network.

What is claimed is:

1. A variable frequency synthesizer including a plurality of latched accumulator networks recombined in series and accepting a digital number used to form a variable divisor, the frequency of a variable frequency oscillator output signal is controlled by dividing the output signal frequency in a divider with the variable divisor forming an intermediate signal, comparing the phase of the intermediate signal with a reference signal and generating a first error signal indicative of a phase difference therebetween, the first error signal is coupled to a control input of the variable frequency oscillator, the variable frequency synthesizer comprising:
    means for generating a first latched output signal and a first carry output signal which is an integral of the digital number;
    means for generating a second latched output signal and a second carry output signal which is an integral of said first latched output signal;
    means for generating a third latched output signal and a third carry output signal which is an integral of said second latched output signal;
    means for generating a fifth output signal comprising:
        means for differentiating said third carry output signal, forming a fourth signal;
        means for combining said fourth signal and said second carry output signal, forming said fifth output signal; means for generating the variable divisor signal comprising:
        means for differentiating said fifth output signal, forming a sixth signal, and
        means for combining said sixth signal and said first carry output signal, forming said variable divisor signal; and
    means for coupling said variable divisor signal to the divider.

2. A variable frequency synthesizer in accordance with claim 1 wherein said means for generating said variable divisor signal further comprises delaying said first carry output signal for a first predetermined period and said means for generating said fifth output signal further comprises delaying said second carry output signal for a second predetermined period.

3. A variable frequency synthesizer in accordance with claim 2 wherein said first predetermined period is twice as long as said second predetermined period.

4. A variable frequency synthesizer in accordance with claim 1 further comprising at least one additional means for generating a latched output signal and a carry output signal which is an integral of an input signal and a corresponding means for generating an output signal which is a combination of a derivation of an output signal and a latched output signal.

5. A variable frequency synthesizer in accordance with claim 1 further comprising means for reducing the residual error of the variable frequency synthesizer.

6. A variable frequency synthesizer in accordance with claim 5 wherein said means for reducing comprises:
    means for combining said third latched output signal and said second latched output signal, generating a residual error correction signal; and
    means for coupling said residual error correction signal to a loop filter.

7. A variable frequency synthesizer in accordance with claim 6 wherein said means for coupling further comprises means for differentiating said residual error correction signal.

8. A variable frequency synthesizer in accordance with claim 6 wherein said means for combining further comprises means for delaying said second latched output signal for a third predetermined period.

9. A variable frequency synthesizer in accordance with claim 1 wherein said means for generating said fifth output signal further comprises delaying said fifth output signal and said first carry output signal for a fourth predetermined period.

10. A variable frequency synthesizer in accordance with claim 1 wherein said means for generating said variable divisor signal further comprises delaying said variable divisor signal for a fifth predetermined period.

11. A variable frequency synthesizer in accordance with claim 1 wherein the digital number is varied in time, in response to an information signal, to form a desired continuous envelope modulation format.

12. A variable frequency synthesizer comprising:
    a variable frequency oscillator for generating an output signal having a selectable output frequency which is a rational multiple of the frequency of a reference signal;

means for generating a clock signal;

means for frequency dividing having a first input coupled to an output of said variable frequency oscillator and a second input coupled to a variable divisor control signal, said means for frequency dividing generating an intermediate signal having a frequency equal to the frequency of the variable frequency output signal divided by a value of said variable divisor control signal;

means for comparing phase of said intermediate signal to a phase of a reference signal and generating an error signal indicative of a phase difference therebetween, an input of said means for comparing coupled to an output of said means for frequency dividing, said error signal coupled to a control input of said variable frequency oscillator;

first means, responsive to a second control signal representative of a fractional divisor value, for generating a first modulation signal to periodically temporarily alter said variable divisor signal such that said means for frequency dividing has a predetermined average rational divisor value, said first means for generating comprising:

means for integrating said control signal, forming a first output signal and a first carry output signal, means for latching said first output signal on a first occurrence of said clock signal, and means for delaying said first carry output signal until a third occurrence of said clock signal;

second means, responsive to said first latched output signal, for generating a second modulation signal varying the value of said variable divisor value comprising:

means for integrating said first latched output signal, forming a second output signal and a second carry output signal, means for latching said second output signal on a second occurrence of said clock signal, means for delaying said second carry output signal until a third occurrence of said clock signal; and third means, responsive to said second latched output signal, for generating a third modulation signal varying the value of said variable divisor value comprising:

means for integrating said second latched output signal, forming a third output signal and a third carry output signal means for latching said third output signal on a third occurrence of said clock signal, means for differentiating said third carry output signal and combining resulting signal with said second delayed carry output signal, forming a fourth output signal, means for differentiating said fourth output signal and combining the resulting signal with said first delayed carry output signal, forming said variable divisor control signal coupled to said input of said means for dividing.

13. A variable frequency synthesizer in accordance with claim 12 wherein said means for latching latches said carry output signals in addition to the output signals.

14. A variable frequency synthesizer in accordance with claim 12 further comprising at least one additional means, responsive to said third latched output signal, for generating a fourth modulation signal in a manner consistent with said third means.

15. A variable frequency synthesizer in accordance with claim 12 wherein said means for generating a clock signal is a fixed reference oscillator.

16. A variable frequency synthesizer in accordance with claim 12 wherein said means for generating a clock signal is an output of said means for frequency dividing.

17. A method of signal frequency synthesis in a variable frequency synthesizer including a plurality of latched accumulator networks recombined in series and accepting a digital number used to form a variable divisor, a controllable oscillator output signal frequency is controlled by dividing the output signal frequency in a divider with the variable divisor forming an intermediate signal, comparing the phase of the intermediate signal with a reference signal and generating a first error signal indicative of a phase difference therebetween, the first error signal is coupled to a control input of the controllable oscillator, the method comprising the steps of:

generating a first latched output signal and a first carry output signal which is an integral of the digital number;

generating a second latched output signal and a second carry output signal which is an integral of said first latched output signal;

generating a third latched output signal and a third carry output signal which is an integral of said second latched output signal;

generating a fifth output signal comprising:
differentiating said third carry output signal, forming a fourth signal;
combining said fourth signal and said second carry output signal, forming said fifth output signal;
generating the variable divisor signal comprising:
differentiating said fifth output signal, forming a sixth signal, and
combining said sixth signal and said first carry output signal, forming said variable divisor signal; and coupling said variable divisor signal to the divider.

18. A method of signal frequency synthesis in a variable frequency synthesizer in accordance with claim 17 wherein said step of generating said variable divisor signal further comprises the step of delaying said first carry output signal for a first predetermined period and said step of generating said fifth output signal further comprises delaying said second carry output signal for a second predetermined period.

19. A method of signal frequency synthesis in a variable frequency synthesizer in accordance with claim 18 wherein said first predetermined period is twice as long as said second predetermined period.

20. A method of signal frequency synthesis in a variable frequency synthesizer in accordance with claim 17 further comprising the step of reducing the residual error of the variable frequency synthesizer.

21. A method of signal frequency synthesis in a variable frequency synthesizer in accordance with claim 20 wherein said step of reducing further comprises the steps of:

combining said third latched output signal and said second latched output signal, generating a residual error correction signal; and coupling said residual error correction signal to a loop filter.

22. A radiotelephone including a radio receiver, a radio transmitter, and a controller, the radiotelephone comprising:
  means for generating a local oscillator signal for the radio receiver and a transmit signal for the transmitter comprising:
    a variable frequency oscillator for generating an output signal having a selectable output frequency which is a rational multiple of the frequency of a reference signal,
    means for generating a clock signal,
    means for frequency dividing having a first input coupled to the output of said variable frequency oscillator and a second input coupled to a variable divisor control signal, said means for frequency dividing generating an intermediate signal having a frequency equal to the frequency of the variable frequency output signal divided by a value of said variable divisor control signal,
    means for comparing phase of said intermediate signal to a phase of a reference signal and generating an error signal indicative of a phase difference therebetween, an input of said means for comparing coupled to an output of said means for frequency dividing, said error signal coupled to a control input of said variable frequency oscillator,
    first means, responsive to a second control signal representative of a fractional divisor value, for generating a first modulation signal to periodically temporarily alter said variable divisor signal such that said means for frequency dividing has a predetermined average rational divisor value, said means for generating comprising:
      means for integrating said control signal, forming a first output signal and a first carry output signal,
      means for latching said first output signal on a first occurrence of said clock signal, and
      means for delaying said first carry output signal until a third occurrence of said clock signal,
    second means, responsive to said first latched output signal, for generating a second modulation signal varying the value of said variable divisor value comprising:
      means for integrating said first latched output signal, forming a second output signal and a second carry output signal,
      means for latching said second output signal on a second occurrence of said clock signal,
      means for delaying said second carry output signal until a third occurrence of said clock signal, and
    third means, responsive to said second latched output signal, for generating a third modulation signal varying the value of said variable divisor value comprising:
      means for integrating said second latched output signal, forming a third output signal and a third carry output signal
      means for latching said third output signal on a third occurrence of said clock signal,
      means for differentiating said third carry output signal and combining resulting signal with said second delayed carry output signal, forming a fourth output signal,
      means for differentiating said fourth output signal and combining the resulting signal with said first delayed carry output signal, forming said variable divisor control signal coupled to said input of said means for dividing; and
  means for generating said second control signal, within the radiotelephone controller, coupled to a first input of said means for generating said local oscillator signal.

* * * * *

UNITED STATES PATENT AND TRADEMARK OFFICE
CERTIFICATE OF CORRECTION

PATENT NO. : 5,166,642  Page 1 of 1
APPLICATION NO. : 07/836681
DATED : November 24, 1992
INVENTOR(S) : Alexander W. Hietala It is certified that error appears in the above-identified patent and that said Letters Patent is hereby corrected as shown below:

Title page (22) of the patent, please change the filing date from "Feb. 18, 1982" to --Feb. 18, 1992--

Signed and Sealed this

Eleventh Day of November, 2008

JON W. DUDAS
*Director of the United States Patent and Trademark Office*